US 8,178,889 B2

(12) United States Patent
Kinoshita et al.

(10) Patent No.: US 8,178,889 B2
(45) Date of Patent: May 15, 2012

(54) SEMICONDUCTOR LIGHT EMITTING ELEMENT HAVING A SINGLE DEFECT CONCENTRATED REGION AND A LIGHT EMITTING WHICH IS NOT FORMED ON THE SINGLE DEFECT CONCENTRATED REGION

(75) Inventors: Yoshitaka Kinoshita, Tokyo (JP); Hidenori Kamei, Fukuoka (JP)

(73) Assignee: Panasonic Corporation, Osaka (JP)

( * ) Notice: Subject to any disclaimer, the term of this patent is extended or adjusted under 35 U.S.C. 154(b) by 185 days.

(21) Appl. No.: 12/305,299

(22) PCT Filed: Jun. 19, 2007

(86) PCT No.: PCT/JP2007/062295
§ 371 (c)(1),
(2), (4) Date: Dec. 17, 2008

(87) PCT Pub. No.: WO2008/004437
PCT Pub. Date: Jan. 10, 2008

(65) Prior Publication Data
US 2009/0127568 A1 May 21, 2009

(30) Foreign Application Priority Data
Jul. 5, 2006 (JP) .................. 2006-185219

(51) Int. Cl.
*H01L 33/00* (2010.01)
(52) U.S. Cl. .......... 257/98; 257/101; 257/102; 257/103; 257/87; 257/72; 257/14; 257/23

(58) Field of Classification Search .................... 257/59, 257/13, 79, 98, 101–103, 87, 14, 23, 611
See application file for complete search history.

(56) References Cited

U.S. PATENT DOCUMENTS

| 6,015,979 | A | 1/2000 | Sugiura et al. |
| 6,855,959 | B2 * | 2/2005 | Yamaguchi et al. ............ 257/98 |
| 7,176,499 | B2 | 2/2007 | Asatsuma et al. |
| 7,372,080 | B2 * | 5/2008 | Goto et al. ........................ 257/99 |
| 2001/0032975 | A1 | 10/2001 | Yamaguchi et al. |
| 2003/0132441 | A1 | 7/2003 | Takatani et al. |
| 2004/0164308 | A1 | 8/2004 | Asatsuma et al. |
| 2004/0245540 | A1 | 12/2004 | Hata et al. |
| 2005/0141577 | A1 * | 6/2005 | Ueta et al. ........................ 372/43 |

FOREIGN PATENT DOCUMENTS

| CN | 1582520 A | 2/2005 |
| JP | 11-233893 | 8/1999 |

(Continued)

OTHER PUBLICATIONS

Machine translation of JP2006-156509 has been attached.*

(Continued)

*Primary Examiner* — Wai Sing Louie
*Assistant Examiner* — Bilkis Jahan
(74) *Attorney, Agent, or Firm* — McDermott Will & Emery LLP

(57) ABSTRACT

A semiconductor light emitting element includes a substrate 11 having a defect concentrated region 11a which has a crystal defect density higher than in the other region. On the substrate 11, a semiconductor layer 12 is formed. On the defect concentrated region 11a, a first electrode 13 is formed. On the semiconductor layer 12, a second electrode 14 is formed.

10 Claims, 6 Drawing Sheets

FOREIGN PATENT DOCUMENTS

| | | |
|---|---|---|
| JP | 2000-021789 | 1/2000 |
| JP | 2001-274521 | 10/2001 |
| JP | 2002-033512 | 1/2002 |
| JP | 2003-124572 | 4/2003 |
| JP | 2003-124573 | 4/2003 |
| JP | 2003-229638 | 8/2003 |
| JP | 2003-243772 | 8/2003 |
| JP | 2003-273470 | 9/2003 |
| JP | 2004-260152 | 9/2004 |
| JP | 2006-024713 | 1/2006 |
| JP | 2006-156509 * | 6/2006 |

OTHER PUBLICATIONS

Chinese Office Action, w/ English translation thereof, issued in Chinese Patent Application No. CN 200780022648.7 dated Jun. 8, 2010.

* cited by examiner

SEMICONDUCTOR LIGHT EMITTING ELEMENT HAVING A SINGLE DEFECT CONCENTRATED REGION AND A LIGHT EMITTING WHICH IS NOT FORMED ON THE SINGLE DEFECT CONCENTRATED REGION

RELATED APPLICATIONS

This application is the U.S. National Phase under 35 U.S.C. §371 of International Application No. PCT/JP2007/062295, filed on Jun. 19, 2007, which in turn claims the benefit of Japanese Application No. 2006-185219, filed on Jul. 5, 2006, the disclosures of which Applications are incorporated by reference herein.

TECHNICAL FIELD

The present invention relates to a semiconductor light emitting element and a method for fabricating the same and, more particularly, to a semiconductor light emitting element formed on a substrate having a defect concentrated region with a high crystal defect density and a method for fabricating the same.

BACKGROUND ART

A semiconductor light emitting element includes a semiconductor layer having at least an n-type layer, a light emitting layer, and a p-type layer which are formed on a wafer. Preferably, the wafer on which the semiconductor layer is formed is free of crystal defects, and has excellent crystallinity. As a method for reducing crystal defects in a wafer, a method has been known which forms a region called a crystal defect region (core) in the wafer. The core is a region which has a crystal defect density higher than in the other region, and is formed to extend through the wafer. By forming the core in the wafer, it is possible to concentrate the crystal defects in the core. By concentrating the crystal defects in the core, a region free of crystal defects and having excellent crystallinity is formed around the core. By forming the semiconductor layer of the semiconductor light emitting element over the region with excellent crystallinity, which is other than the core of the wafer, the light emitting element having excellent characteristics can be realized.

For example, Patent Document 1 discloses a nitride-compound-semiconductor light emitting element which is formed by using a wafer made of gallium nitride (GaN) and having a plurality of periodically formed cores. The nitride-compound light emitting element disclosed in Patent Document 1 uses the wafer in which the plurality of cores are periodically arranged, and regions each having excellent crystallinity are formed between the cores. By forming ridge stripes in the regions of the wafer with excellent crystallinity, the semiconductor light emitting element utilizing semiconductor layer with excellent crystallinity is realized. In addition, by forming electrodes in the regions other than the cores, a current is prevented from flowing in the cores. This prevents an increase in leakage current due to the cores.

Patent Document 1: Japanese Laid-Open Patent Publication No. 2003-229638

DISCLOSURE OF THE INVENTION

Problems to be Solved by the Invention

However, when the electrodes are formed in the regions other than the cores, the portions of the cores become completely useless to cause the problems of a reduced number of semiconductor light emitting elements obtainable from a single wafer, and lower production efficiency.

An object of the present invention is to solve the conventional problems described above, and allow the realization of a semiconductor light emitting element having electric characteristics which are less susceptible to degradation due to a defect concentrated region.

Means for Solving the Problems

To attain the object mentioned above, the present invention provides a semiconductor light emitting element with a structure in which one electrode is formed in a region located over a semiconductor layer and over a crystal defect region (core).

Specifically, a semiconductor light emitting element according to the present invention includes: a substrate having a defect concentrated region which has a crystal defect density higher than in the other region thereof; a semiconductor layer formed on the substrate; a first electrode formed on the defect concentrated region; and a second electrode formed on the semiconductor layer.

In the semiconductor light emitting element of the present invention, the first electrode is formed on the defect concentrated region so that a current flowing from the second electrode to the first electrode flows from the entire second electrode to the first electrode through the semiconductor layer. Therefore, the current does not flow in the defect concentrated region within the substrate so that the occurrence of a leakage current in the defect concentrated region is prevented. As a result, even when the substrate contains the defect concentrated region, the electric characteristics of the semiconductor light emitting element are scarcely adversely affected thereby. In addition, the defect concentrated region does not become useless.

In the semiconductor light emitting element of the present invention, the semiconductor layer may include an n-type layer, a light emitting layer, and a p-type layer which are formed successively on the substrate, the first electrode may be formed on the n-type layer, and the second electrode may be formed on the p-type layer.

In the semiconductor light emitting element of the present invention, the defect concentrated region may be formed either in a peripheral portion of the substrate or in a center portion of the substrate. In this case, the peripheral portion of the substrate is preferably a corner portion of the substrate.

In the semiconductor light emitting element of the present invention, the substrate is preferably a cut out portion of a wafer in which the defect concentrated regions are periodically arranged.

A method for fabricating a semiconductor light emitting element according to the present invention includes the steps of: preparing a wafer in which a plurality of defect concentrated regions are periodically arranged; forming a semiconductor layer on the wafer; forming a first electrode on each of the defect concentrated regions; and forming a second electrode on the semiconductor layer.

Since the method for fabricating a semiconductor light emitting element of the present invention uses the wafer in which the plurality of defect concentrated regions are periodically arranged, the alignment of the first electrode is easy. Accordingly, the production efficiency improves. In addition, it is possible to increase the number of semiconductor light emitting elements obtainable from a single wafer.

Effect of the Invention

In accordance with the present invention, it is possible to realize a semiconductor light emitting element with electric characteristics which are less susceptible to degradation due to a defect concentrated region without lowering production efficiency.

BRIEF DESCRIPTION OF THE DRAWINGS

FIGS. 1A and 1B show a semiconductor light emitting element according to a first embodiment of the present invention, of which FIG. 1A is a plan view and FIG. 1B is a cross-sectional view along the line Ib-Ib;

FIGS. 6A and 6B show a semiconductor light emitting element according to a second embodiment of the present invention, of which FIG. 6A is a plan view and FIG. 6B is a cross-sectional view along the line VIb-VIb.

| DESCRIPTION OF NUMERALS | |
|---|---|
| 11 | Substrate |
| 11a | Core |
| 12 | Semiconductor Layer |
| 12a | Defect Concentrated Portion |
| 13 | n-Side Electrode |
| 14 | p-Side Electrode |
| 15 | Wafer |
| 16 | Epitaxial Layer |
| 19 | Adhesive Sheet |
| 121 | n-Type Layer |
| 122 | Light Emitting Layer |
| 123 | p-Type Layer |
| 141 | p-Side Electrode Material |
| 171 | Mask Pattern |
| 172 | Resist Pattern |
| 181 | Wax |
| 182 | Ceramic Disc |

BEST MODE FOR CARRYING OUT THE INVENTION

Embodiment 1

Figure 1A:
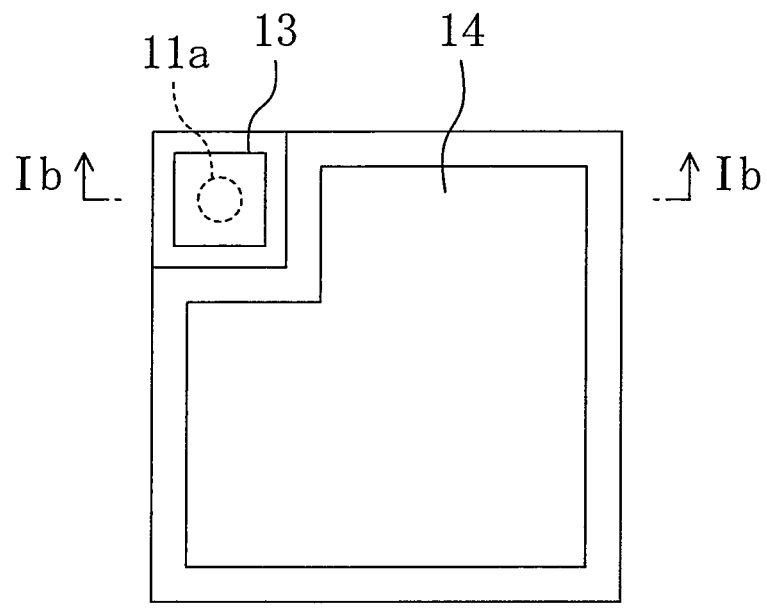
Figure 1B:
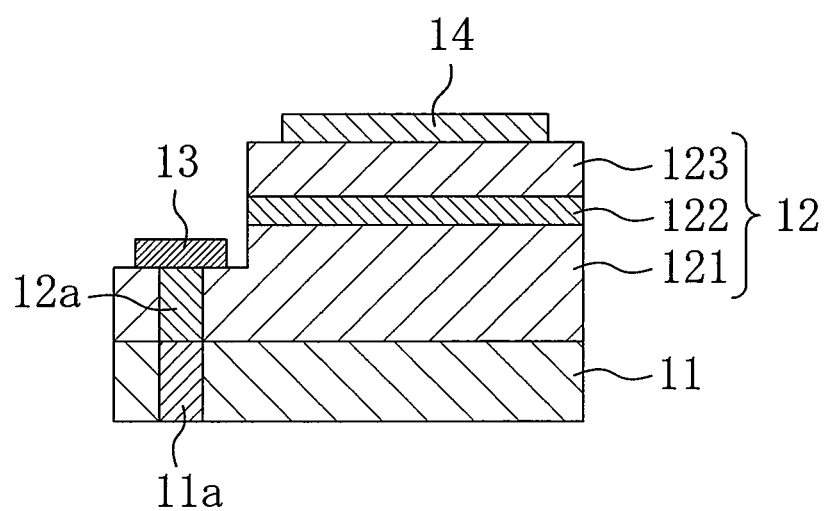

A first embodiment of the present invention will be described with reference to the drawings. FIGS. 1A and 1B show a semiconductor light emitting element according to the first embodiment of the present invention, of which FIG. 1A shows a plan structure thereof and FIG. 1B shows a cross-sectional structure thereof along the line Ib-Ib;

As shown in FIG. 1, a semiconductor light emitting element according to the first embodiment is formed on a substrate 11 having a defect concentrated region (core) 11a where crystal defects are more concentrated than in the other region thereof. In the present embodiment, the substrate 11 is a single-crystal substrate made of a nitride semiconductor such as gallium nitride (GaN), and shaped as a cube having sides each 1000 μm long, and a thickness of 300 μm. The core 11a extends through the substrate 11 in the thickness direction thereof, and is formed in the corner portion of the substrate in the present embodiment.

On the substrate 11, a semiconductor layer 12 is formed. The semiconductor layer 12 has an n-type layer 121, a light emitting layer 122, and a p-type layer 123 which are formed successively on the substrate 11.

The n-type layer 121 is made of GaN, aluminum gallium nitride (AlGaN), or the like having a thickness in a range of 0.5 μm to 10 μm, and has an n-type conductivity. It is also possible to provide a buffer layer made of GaN, indium gallium nitride (InGaN), or the like between the n-type layer 121 and the substrate 11.

The light emitting layer 122 has a multiple quantum well structure in which well layers each made of InGaN or the like having a thickness in a range of 0.001 to 0.005 μm, and barrier layers each made of GaN or the like having a thickness in a range of 0.005 μm to 0.02 μm are alternately laminated. It is also possible to insert an n-type semiconductor layer containing indium (In) between the light emitting layer 122 and the n-type layer 121.

The p-type layer 123 is made of AlGaN, GaN, or the like having a thickness in a range of 0.05 μm to 1 μm, and has a p-type conductivity.

The portion of the semiconductor layer 12 which is formed on the core 11a forms a defect concentrated portion 12a in which crystal defects are more concentrated than in the other portion. In the semiconductor light emitting element, of the present embodiment, the p-type layer 123, the light emitting layer 122, and the n-type layer 121 are each partly removed in a region including the defect concentrated portion 12a so that a recessed portion exposing the n-type layer 121 is formed.

On the exposed portion of the n-type layer 121, an n-side electrode (first electrode) 13 is formed. On the p-type layer 123 forming a mesa portion, a p-side electrode (second electrode) 14 is formed. As a result, the n-side electrode 13 is formed in the region of the semiconductor layer 12 which is located over the core 11a of the semiconductor substrate 11. On the other hand, the p-side electrode 14 is formed in the region of the semiconductor layer 12 which is other than the region located over the core 11a.

The n-side electrode 13 of the present embodiment has an n-contact electrode and an n-bonding electrode which are formed successively on the n-type layer 121. For the n-contact electrode, a single-layer film made of platinum (Pt), nickel (Ni), cobalt (Co), aluminum (Al), titanium (Ti), or the like, or a multilayer film composed thereof may be used appropriately. For the n-bonding electrode, gold (Au), Al, or the like may be used appropriately. In particular, in terms of a bonding properly, the outermost layer is preferably made of Au. In the present embodiment, Ti is used for the n-contact electrode, and Au is used for the n-bonding electrode. It is also possible to insert a barrier layer made of platinum (Pt) or the like between the n-contact electrode and the n-bonding electrode.

The p-side electrode 14 of the present embodiment has a p-contact electrode, a reflection electrode, and a p-bonding electrode which are formed successively on the p-type layer 123. By making the p-contact electrode of Pt having a film thickness of about 0.001 μm, it is possible to allow the p-contact electrode to retain a high transmittance, while suppressing a contact resistance. The reflection electrode is preferably formed of rhodium (Rh), silver (Ag), an Ag alloy, or the like having a high reflectance so as to reflect light from the light emitting layer 122 toward the substrate 11. To cause light reflection, the thickness of the reflection electrode is preferably set to a value in a range of 0.01 μm to 0.5 μm. For the p-bonding electrode, Au, Al, or the like may be used appropriately. In terms of adhesion with the p-contact electrode and the reflection electrode, it is also possible to laminate Au, Al, or the like and a single-layer film made of Ti, chromium (Cr), molybdenum (Mo), tungsten (W), or the like or a multilayer film composed thereof. In terms of a bonding property, the outermost layer is preferably made of Au. In the present embodiment, the p-bonding electrode is provided with a multilayer structure of Ti and Au. By thus providing a structure as mentioned above, the light generated in the light emitting layer can be reflected by the p-side electrode, and extracted from the substrate 11.

The p-side electrode 14 may also be provided with a transparent electrode structure. In this case, the light generated in the light emitting layer can be extracted from the p-side electrode 14. In this case, a transparent film made of indium tin oxide (ITO) or the like to serve as the p-contact electrode is formed on substantially the entire surface of the p-type layer 123, and the p-bonding electrode (pad electrode) is locally formed thereon. In the p-bonding electrode, it is appropriate to use Ti or Rh for the first layer, and use Au for the second layer.

In the semiconductor light emitting element according to the present embodiment, a current flowing from the p-side electrode 14 to the n-side electrode 13 flows from the entire p-side electrode 14 to the n-side electrode 13 through the p-type layer 123, the light emitting layer 122, and the n-type layer 121 without flowing in the core 11a within the substrate 11. This allows the prevention of the occurrence of a leakage current in the core 11a. Therefore, even when the substrate 11 contains the core 11a, the core 11a scarcely adversely affects the electric characteristics of the semiconductor light emitting element.

Additionally, the semiconductor light emitting element according to the present embodiment is formed such that the core 11a is located in the peripheral portion of the substrate 11. As a result, the n-side electrode 13 is disposed on the peripheral portion of the semiconductor layer 12. Accordingly, the area of the portion of the light emitting layer 122 which should be removed for the formation of a region where the n-side electrode 13 is formed is small. Therefore, it is possible to ensure a large light emitting area, and intend higher brightness. In particular, since the n-side electrode 13 is formed at the corner portion of the semiconductor layer 12 in the semiconductor light emitting element of the present embodiment, it is possible to ensure a large light emitting area, and intend higher brightness by forming the substrate 11 into a square plan shape.

Figure 2A:
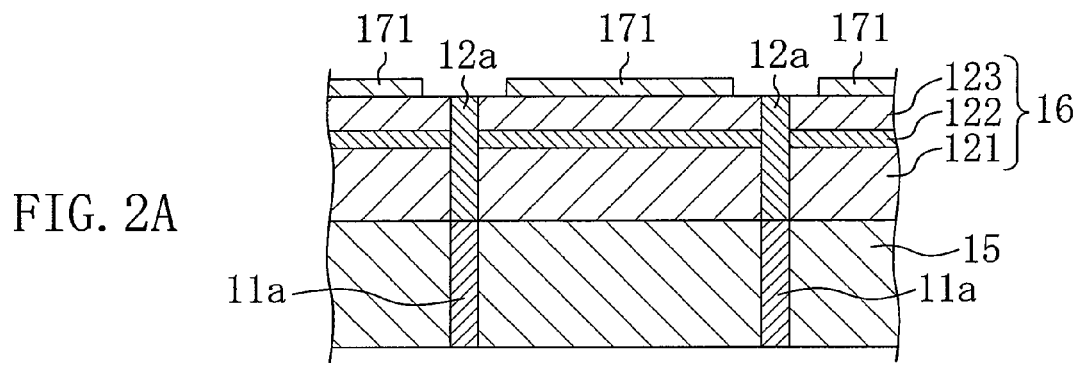
FIGS. 2A to 2D are cross-sectional views illustrating a method for fabricating the semiconductor light emitting element according to the first embodiment of the present invention in the order of process steps.

Referring to the drawings, a method for fabricating the semiconductor light emitting element according to the first embodiment will be described hereinbelow. FIGS. 2 to 5 show the method for fabricating the semiconductor light emitting element according to the present embodiment in the order of process steps First, as shown in FIG. 2A, a wafer 15 made of GaN is prepared. The wafer 15 has a plurality of the cores 11a that are formed periodically. Subsequently, the n-type layer 121, the light emitting layer 122, and the p-type layer 123 are epitaxially grown successively on the wafer 15 to form an epitaxial layer 16 serving as the semiconductor layer 12. The portions of the epitaxial layer 16 which are formed on the cores 11a form the defect concentrated portions 12a in which crystal defects are more concentrated than in the other portion. Further, a silicon dioxide ($SiO_2$) film having a thickness of about 0.5 μm is formed on the epitaxial layer 16 using a chemical vapor deposition (CVD) method, a sputter method, a vacuum evaporation method, or the like. Thereafter, the $SiO_2$ film is patterned using photolithography to form a $SiO_2$ mask pattern 171. At this time, the $SiO_2$ mask pattern 171 is formed to expose the defect concentrated portions 12a.

Figure 2B:
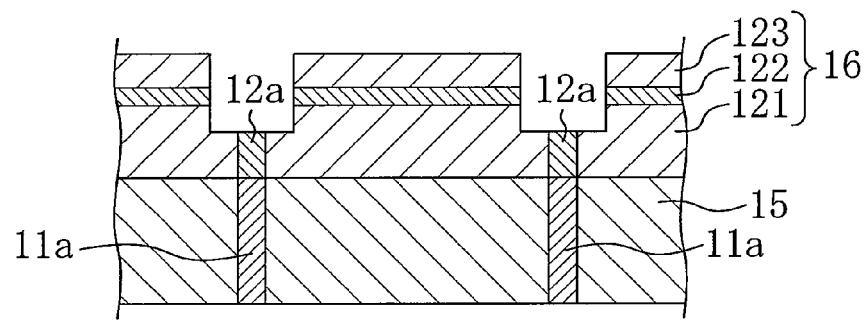

Next, as shown in FIG. 2B, depressed portions are formed in regions including the defect concentrated portions by partly removing each of the p-type layer 123, the light emitting layer 122, and the n-type layer 121 from the crystal growth surface of the epitaxial layer 16 using a reactive ion etching (RIE) method. After the formation of the depressed portions, the $SiO_2$ mask pattern 171 is removed by etching.

Figure 2C:
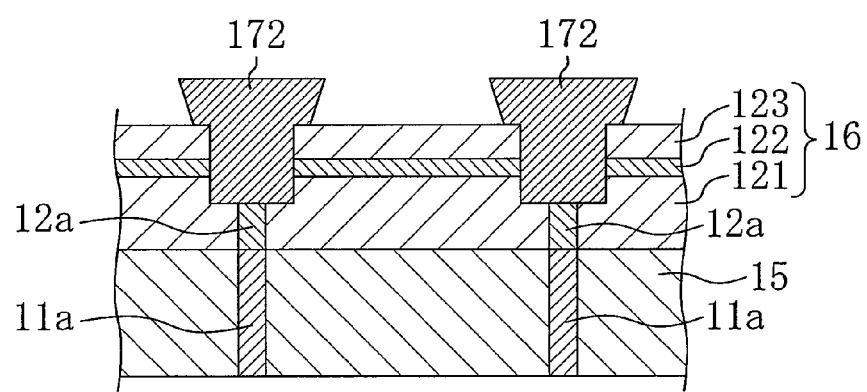

Next, as shown in FIG. 2C, a resist pattern 172 covering at least the depressed portions and the peripheries thereof is formed.

Figure 2D:
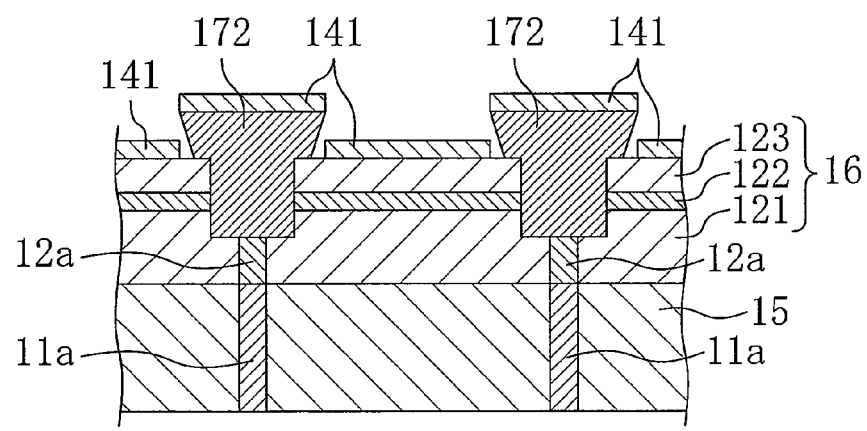

Next, as shown in FIG. 2D, a p-side electrode material 141 is vapor-deposited on substantially the entire surface of the wafer by using the resist pattern 172 as a mask.

Figure 3A:
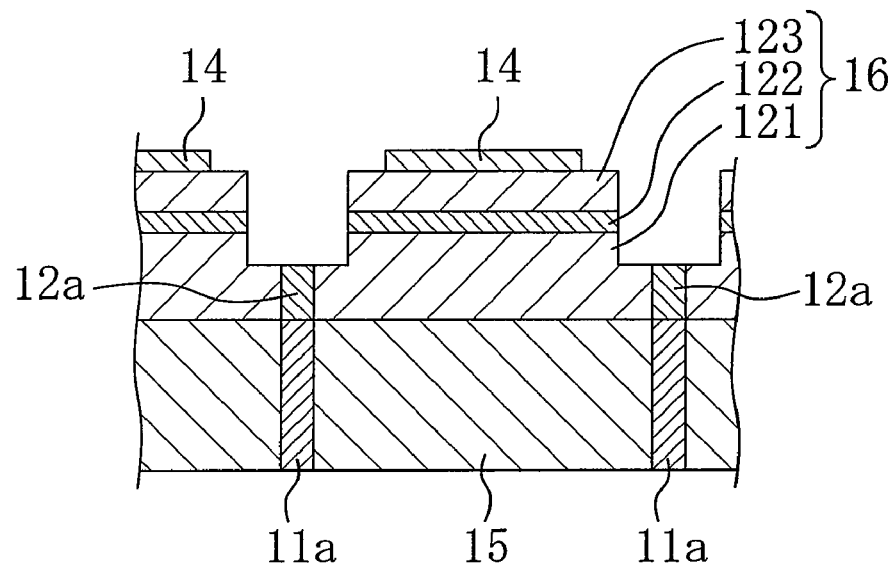
FIGS. 3A and 3B are cross-sectional views illustrating the method for fabricating the semiconductor light emitting element according to the first embodiment of the present invention in the order of process steps.

Next, as shown in FIG. 3A, the p-side electrodes 14 are formed by lifting off the resist pattern.

Figure 3B:
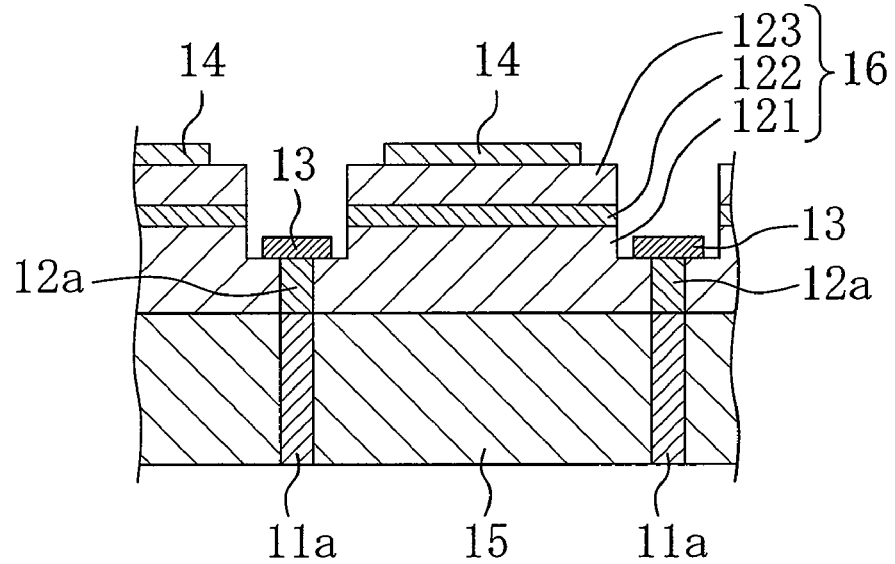

Next, as shown in FIG. 3B, after a resist pattern exposing the depressed portions is formed, an n-side electrode material is vapor-deposited on substantially the entire surface of the wafer, and then the n-side electrodes 13 are formed by lifting off the resist pattern. It is to be noted that the order in which the p-side electrodes 14 and the n-side electrodes 13 are formed may also be reversed.

Figure 4A:
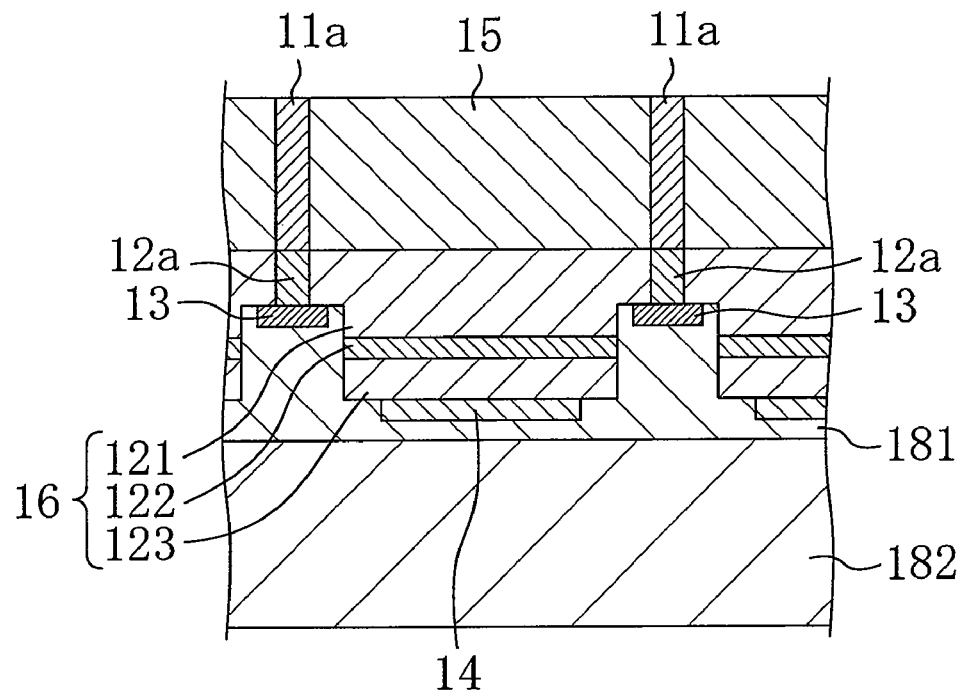
FIGS. 4A and 4B are cross-sectional views illustrating the method for fabricating the semiconductor light emitting element according to the first embodiment of the present invention in the order of process steps.
Figure 4B:
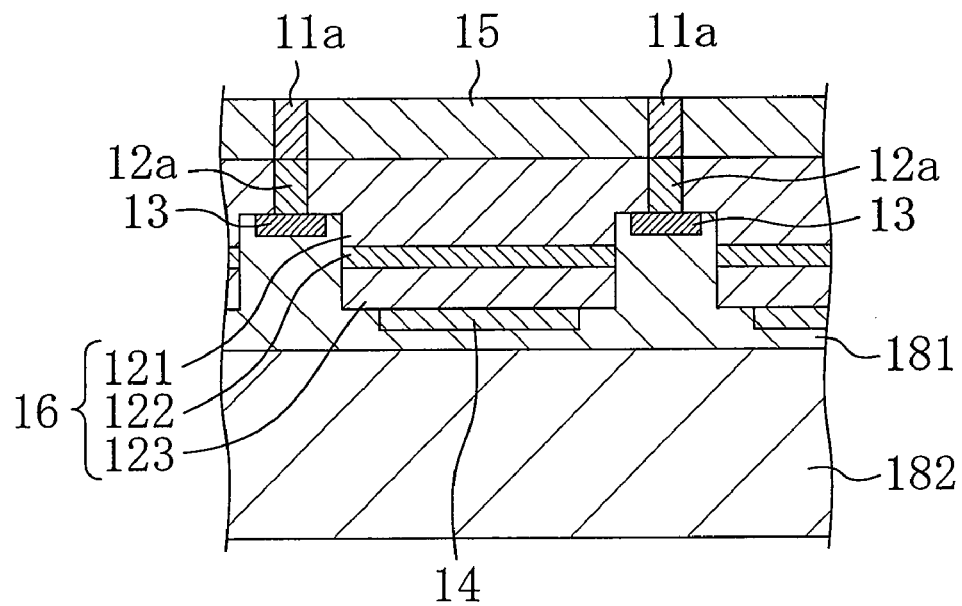

Next, as shown in FIGS. 4A and 4B, grinding and polishing is performed with respect to the back surface of the wafer 15. In the grinding and polishing, the back surface of the wafer 15 is oriented upward by placing the wafer 15 on a ceramic disc 182 coated with wax 181 so that the crystal growth surface thereof faces downward. Then, using a polishing apparatus, polishing is performed with respect to the back surface of the wafer 15 to provide a predetermined thickness and predetermined surface roughness. As a result, it becomes possible to stably perform the dicing of the wafer 15.

Figure 5A:
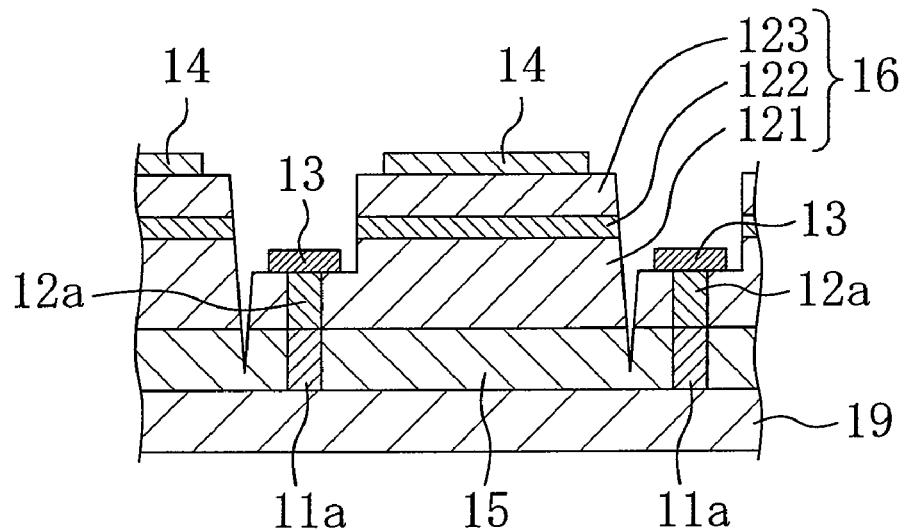
FIGS. 5A and 5B are cross-sectional views illustrating the method for fabricating the semiconductor light emitting element according to the first embodiment of the present invention in the order of process steps.
Figure 5B:
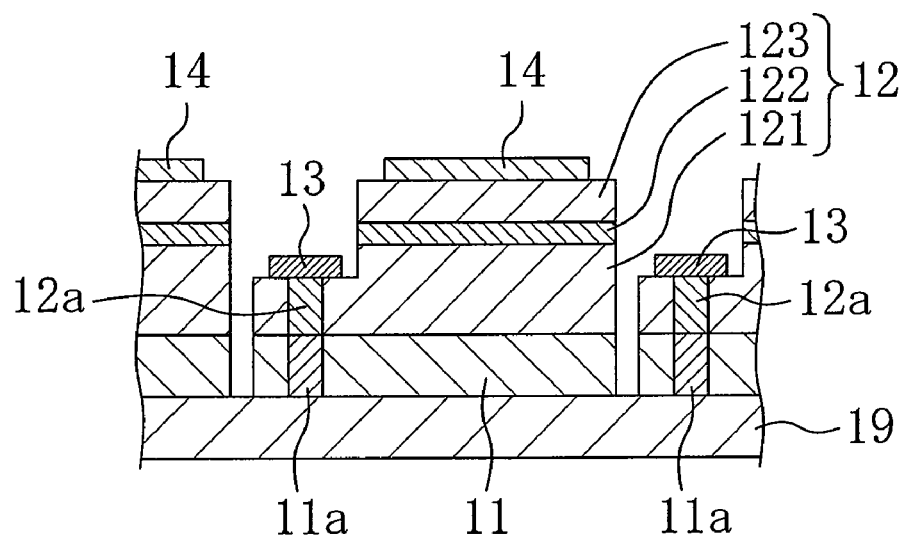

Next, as shown in FIG. 5A, the wafer 15 to which polishing has been completed is sticked to an adhesive sheet 19, and scribing is performed by laser scribing. Then, as shown in FIG. 5B, the wafer 15 is divided by braking into separate chips each having a predetermined configuration. It is also possible to omit grinding and polishing depending on the size of each of the chips. To remove an adherent which has occurred during chip separation, cleaning with an acid and pure water is performed as necessary. In this manner, the semiconductor light emitting elements in which the n-side electrodes 13 are formed on the cores 11a can be realized.

By thus using a wafer having the periodically formed cores 11a as the wafer 15 on which the epitaxial layer 16 serving as the semiconductor layer 12 is to be formed, the positions where the n-side electrodes 13 are to be formed can be easily determined in accordance with the positions of the cores 11a. Therefore, it is possible to fabricate a maximum number of the semiconductor light emitting elements from the wafer 15 having a limited size.

Embodiment 2

Figure 6A:
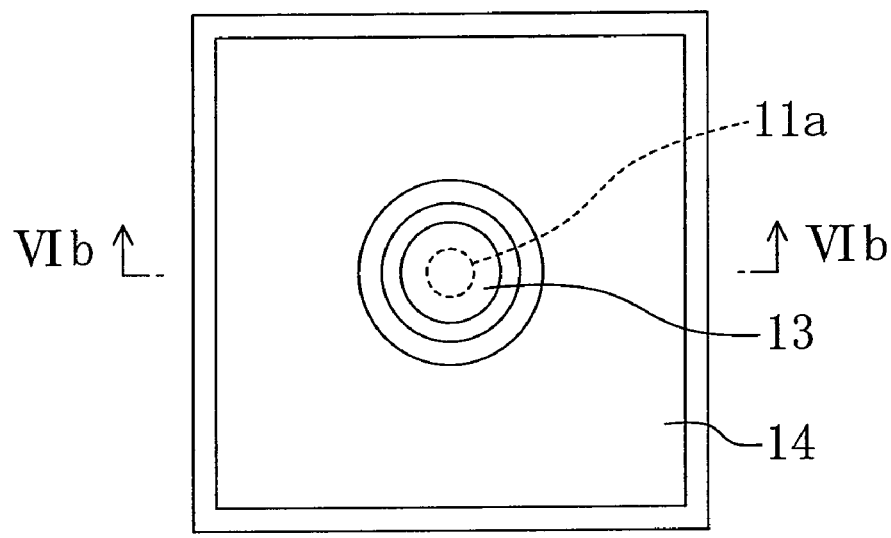
Figure 6B:
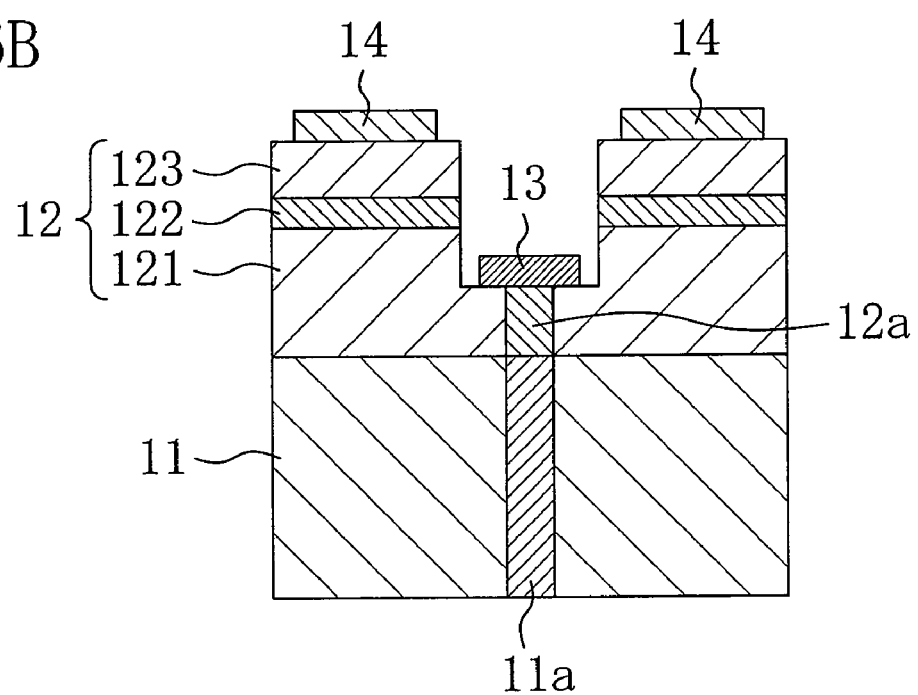

A second embodiment of the present invention will be described hereinbelow with reference to the drawings. FIGS. 6A and 6B show a semiconductor light emitting element according to the second embodiment, of which FIG. 6A shows a plan structure thereof, and FIG. 6B shows a cross-sectional structure thereof along the line VIb-VIb. The description of the components shown in FIGS. 6A and 6B which are the same as those shown in FIG. 1 will be omitted by providing the same reference numerals.

As shown in FIGS. 6A and 6B, the semiconductor light emitting element of the present embodiment has the core 11a formed in substantially the center of the substrate 11. Accordingly, the n-side electrode 13 is positioned at the center portion of the semiconductor layer 12. As a result, the current from the p-side electrode 14 flows from the entire p-side electrode 14 to the n-side electrode 13 positioned at the center portion of the semiconductor layer 12 through the p-type layer 123, the light emitting layer 122, and the n-type layer 121. Therefore, in the light emitting element of the present embodiment, the current has an excellent diffusion property so that a drive voltage is reduced. It is to be noted that the core ha need not be positioned at the exact center of the substrate.

In the semiconductor light emitting element according to the present embodiment, the core 11a is formed in a cylindrical shape so that the n-side electrode 13 is formed in a circular shape which is slightly larger than the shape of the core 11a. When the n-side electrode 13 is formed in a circular shape of the same size as that of the core 11a, all the currents flowing in the n-side electrode 13 pass through the core 11a so that the drive voltage increases undesirably. In the semiconductor light emitting element of the present embodiment, the n-side electrode 13 is formed in the circular shape larger than that of the core ha so that the current from the p-type layer 123 flows to the n-side electrode 13 without passing through the core 11a. As a result, it is possible to ensure a high current diffusion property. However, when the n-side electrode 13 is formed excessively large in size, the light emitting region is reduced so that the size of the n-side electrode 13 is preferably determined properly relative to the core 11a. Thus, it becomes possible to enlarge the area of the p-side electrode 14, and ensure a larger area for the light emitting region. Although the n-side electrode 13 is formed in the circular shape, it may also be formed in a polygonal shape represented by a square shape or a hexagonal shape. The shape of the core 11a is not also limited to the cylinder.

In each of the first and second embodiments, the n-side electrode 13 is formed on the n-type layer 121. However, it is also possible to expose the substrate 11 in the recessed portion, and form the n-side electrode 13 directly on the substrate 11. Although the example has been shown in which the n-side electrode 13 completely overlaps the core 11a, there should be no problem even when the n-side electrode 13 is displaced from the core 11a, and a part of the core 11a is not covered with the n-side electrode 13.

INDUSTRIAL APPLICABILITY

In accordance with the present invention, it is possible to realize a semiconductor light emitting element having electric characteristics which are less susceptible to degradation due to a defect concentrated region without reducing production efficiency. The present invention is particularly useful for a semiconductor light emitting element formed on a substrate having a defect concentrated region with a high crystal defect density, and for a method for fabricating the same.

The invention claimed is:

1. A semiconductor light emitting element comprising:
    a substrate having only a single defect concentrated region which has a crystal defect density higher than in the other region thereof;
    a semiconductor layer formed on the substrate and including an n-type layer, a light emitting layer, and a p-type layer which are formed successively on the substrate;
    a first electrode formed on the defect concentrated region; and
    a second electrode formed on the semiconductor layer, wherein
    the single defect concentrated region does not traverse the substrate and does not divide a region having a crystal structure different from a crystal structure of the defect concentrated region into two separate regions,
    a region of the substrate except the defect concentrated region has the same crystal structure, and
    the light emitting layer is formed on a region except the defect concentrated region.

2. The semiconductor light emitting element of claim 1, wherein
    the first electrode is formed on the n-type layer, and
    the second electrode is formed on the p-type layer.

3. The semiconductor light emitting element of claim 1, wherein the defect concentrated region is formed in a peripheral portion of the substrate.

4. The semiconductor light emitting element of claim 3, wherein the peripheral portion of the substrate is a corner portion of the substrate.

5. The semiconductor light emitting element of claim 1, wherein the defect concentrated region is formed in a center portion of the substrate.

6. The semiconductor light emitting element of claim 5, wherein the second electrode is formed so as to surround the defect concentrated region.

7. The semiconductor light emitting element of claim 1, wherein the substrate is a cut out portion of a wafer in which the defect concentrated regions are periodically arranged.

8. The semiconductor light emitting element of claim 1, wherein
    the semiconductor layer includes an n-type layer, a light emitting layer, and a p-type layer which are formed successively on the substrate,
    the first electrode is formed on the substrate, and
    the second electrode is formed on the p-type layer.

9. The semiconductor light emitting element of claim 1, wherein a current flowing between the first electrode and the second electrode does not pass through a part of the semiconductor layer formed on the defect concentrated region.

10. The semiconductor light emitting element of claim 9, wherein
    a part of the semiconductor layer formed on the defect concentrated region has the same crystal as the crystal structure of the defect concentrated region, and the rest of the region of the semiconductor layer has a crystal structure different from the crystal structure of the defect concentrated region, and
    the first electrode has a center portion which is in contact with the part of the semiconductor layer having the same crystal as the crystal structure of the defect concentrated region, and a peripheral portion which is in contact with the rest of the semiconductor layer having a crystal structure different from the crystal structure of the defect concentrated region.

* * * * *

UNITED STATES PATENT AND TRADEMARK OFFICE
CERTIFICATE OF CORRECTION

PATENT NO. : 8,178,889 B2
APPLICATION NO. : 12/305299
DATED : May 15, 2012
INVENTOR(S) : Yoshitaka Kinoshita Page 1 of 1

It is certified that error appears in the above-identified patent and that said Letters Patent is hereby corrected as shown below:

Title Page In Item (54) and Col. 1, Title reads SEMICONDUCTOR LIGHT EMITTING ELEMENT HAVING A SINGLE DEFECT CONCENTRATED REGION AND A LIGHT EMITTING WHICH IS NOT FORMED ON THE SINGLE DEFECT CONCENTRATED REGION but should read --SEMICONDUCTOR LIGHT EMITTING ELEMENT HAVING A SINGLE DEFECT CONCENTRATED REGION AND A LIGHT EMITTING <u>LAYER</u> WHICH IS NOT FORMED ON THE SINGLE DEFECT CONCENTRATED REGION--

Signed and Sealed this
Second Day of October, 2012

David J. Kappos
*Director of the United States Patent and Trademark Office*